United States Patent [19]

Moss et al.

[11] 4,190,816

[45] Feb. 26, 1980

[54] DIVIDER NETWORK

[75] Inventors: Gerald E. Moss, Hull; Everett E. Stevens, Manotick, both of Canada

[73] Assignee: Her Majesty the Queen in right of Canada, as represented by the Minister of National Defence, Ottawa, Canada

[21] Appl. No.: 870,015

[22] Filed: Jan. 16, 1978

[30] Foreign Application Priority Data

Feb. 11, 1977 [CA] Canada .................................. 271563

[51] Int. Cl.$^2$ ............................................. H03H 7/48
[52] U.S. Cl. .................................... 333/131; 343/853
[58] Field of Search ................... 333/6, 8, 100, 119, 333/124, 131; 343/852, 853, 858

[56] References Cited

U.S. PATENT DOCUMENTS

| | | | |
|---|---|---|---|
| 1,740,851 | 12/1929 | Franklin | 343/853 X |
| 1,992,283 | 2/1935 | Bailey et al. | 343/853 X |
| 2,002,844 | 5/1935 | Aceves et al. | 343/852 X |
| 3,454,905 | 7/1969 | Winegard | 333/8 |

Primary Examiner—Paul L. Gensler
Attorney, Agent, or Firm—Stevens, Davis, Miller & Mosher

[57] ABSTRACT

The present invention relates to a divider network for dividing an HF signal into n output signals of the same power and phase at the same impedance as the input, where n is a positive integer greater than 1. Each of the n signals is fed to an output port. Each of the output ports has associated therewith a transformer. Each of the ports is connected to ground via at least one winding of the transformer. Each of the ports is connected to a common point by a winding of the transformer so that each transformer is connected in parallel with respect to the common point. The HF signal is fed to the divider via an input port. The input port is connected to the common point so that the path length between the input port and each of the output ports is substantially equal.

6 Claims, 3 Drawing Figures

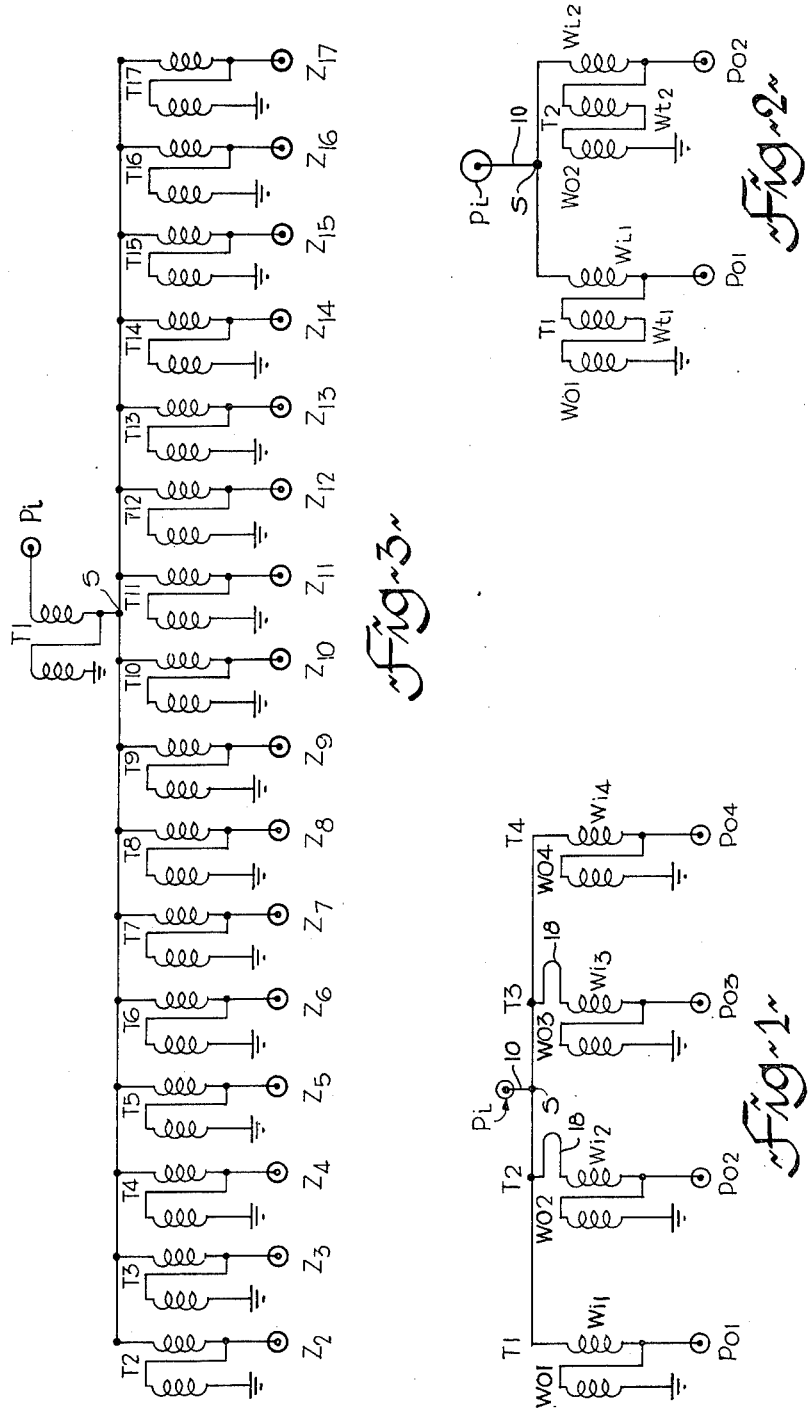

DIVIDER NETWORK

The present invention relates to a divider network for feeding a multiple element antenna array from a single transmitter source.

In many instances it is desirable to feed each antenna in an antenna array with a signal which has the same power and phase. This must be accomplished so that the transmitter output impedance and the input impedance of each antenna in the array is substantially matched over a wide band of frequencies, say, from 3 to 30 MHz in the HF band. Impedance matching is necessary if good efficiency or power transfer between the transmitter and the antennas is to be accomplished.

Prior to this invention it was possible to find multiple transformer networks, but these were very low power networks which acted as combiners to connect multiple element receiving antenna arrays to a common receiver. Transformer combiner networks of this type are required to handle power in the neighbourhood of a few milliwatts and are definitely not usable to connect even a low power transmitter to an antenna array.

Another prior art combiner network employed multiple windings in the same transformer or multiple taps on a winding of a transformer. Both of these systems have the common drawback that all of the power of the transmitter must flow through at least one winding of the transformer. This system is costly and inefficient since with large wire windings, flux coupling is not as good as with smaller wire windings. The multiple tap configuration presented phasing problems.

The present invention utilizes a multiplicity of low power transformers which need only handle a fraction of the power of the transmitter output, with the exception of one of the embodiments to be described below. Since fine wire can be used in the windings, good efficiency is provided. In addition, it becomes possible to use bifilar and even trifilar wound transformers which are broad band over the 3 to 30 MHz band. It should be understood that the present invention can be utilized at frequencies outside this band.

In accordance with the present invention, there is provided a divider network for dividing an HF signal into n output signals of the same power and phase, where n is a positive integer greater than 1, wherein each of said n signals is fed to an output port, each said port having associated therewith a transformer, each said port being connected to ground via at least one winding of said transformer, each port being connected to a common point by a winding of said transformer so that each transformer is connected in parallel with respect to said common point, said HF signal being fed to said divider via an input port, said inputport being connected to said common point so that the path length between said input port and each of said output ports is substantially equal.

The present invention will be described in detail hereinbelow with the aid of the accompanying drawings, in which:

FIG. 1 is a schematic diagram of an embodiment of a 4:1 power divider according to the present invention;

FIG. 2 is a schematic diagram of an embodiment of a 2:1 power divider according to the present invention; and FIG. 3 is an schematic diagram of a 16:1 power divider according to the present invention.

FIG. 1 is a schematic diagram of a 4:1 power divider. Four transformers $T_1$-$T_4$ each have one end of a winding Wi1-Wi4 connected to a common point S. The other end of each winding is connected to a respective output port Po1-Po4. Each transformer $T_1$-$T_4$ has a second winding Wo1-Wo4 coupling a winding Wi1-Wi4, respectively. One end of each winding Wo1-Wo4 is connected to ground with the other end of each winding being connected to a respective output port Po1-Po4. The size of the windings are arranged so that the impedance at point S equals the impedance of the transmitter output. The common point S is connected via conductor 10 to output port Pi. For example, if the output impedance of the transmitter is 50 ohms, then the parallel configuration of transformers $T_1$-$T_4$ presents approximately a 50 ohm impedance at common point S. Similarly, if the input impedance of four antennas, each to be connected to one output port Po1-Po4 is 50 ohms, then the winding ratio of each transformer is such that it presents a 50 ohm output impedance at each output port Po1-Po4. It can be seen that no one transformer in FIG. 1 is required to handle the entire power from the transmitter. In fact, in accordance with the embodiment shown in FIG. 1, each transformer must be capable of handling only one-quarter of the power of the transmitter.

In the embodiment shown in FIG. 1, the transformers can be bifilar wound to provide good coupling over a wide band of frequencies. It should be noted that to provide a similar phase output at each output port Po1-Po4, the path length from the common point S to the output ports Po1-Po4 should be the same. To this end, an additional path length is shown as 18 in FIG. 1.

FIG. 2 is a schematic diagram of a 2:1 power divider according to the present invention. The configuration is similar to the embodiment shown in FIG. 1 except that the transformers are trifilar wound. As a result, the output ports Po1 and Po2 are connected to ground via the series connection of windings Wo1 and Wt1 and Wo2 and Wt2, respectively.

The configuration of the combiner shown in FIG. 3 is similar in principle to the configuration described in FIG. 1. Transformers $T_2$ through $T_{17}$ are connected in parallel to a common point S and provide 16 output ports having impedances Z2 through Z17.

Due to the large number of transformers connected in parallel it is more efficient to employ a step-down transformer $T_1$ to connect input port P1 with the common point S. All transformers through $T_1$-$T_{17}$ shown in FIG. 3 are bifilar wound transformers. Transformer $T_1$ must be capable of handling the entire power of transmitter. However, it should be noted that transformers $T_2$ through $T_{17}$ need only handle one-sixteenth of the total power. As a result, the wire size for transformers $T_2$ through $T_{17}$ can be relatively small thereby yielding good coupling and high efficiency.

It should be noted that the dividers according to the present invention do not provide isolation between the output ports. In the application to which they are intended, i.e., the connection of a single power source to a multiplicity of antenna elements in an antenna array, it is not necessary to provide such isolation.

In order to provide a similar phase at the sixteen output ports shown in FIG. 3, it is necessary that the path length between the common point S and each of the output ports be similar. This feature is illustrated at 18 in FIG. 1 and is not shown again in FIG. 3 which is merely a schematic diagram of the divider configuration.

We claim:

1. A divider network for dividing an HF signal into n output signals of the same power and phase, where n is a positive integer greater than 1, wherein each of said n signals is fed to an output port, each said output port having associated therewith a transformer, each said output port being connected to ground via at least one winding of said transformer, each output port being connected to a common point by a winding of said transformer so that each transformer is connected in parallel with respect to said common point; said HF signal being fed to said divider via an input port, said input port being connected to said common point and said common point being connected to the output port transformer by means providing a path length between said input port and each of said output ports which is substantially equal, said common point being connected to said input port via one winding of another transformer, said common point also being connected to ground by at least one other winding of said another transformer.

2. A divider network according to claim 1, wherein said input port and said common point are connected by a conductor.

3. A divider network according to claim 1, wherein said transformer associated with each of said n output ports and said another transformer are bifilar wound transformers.

4. A divider network according to claim 1, wherein each transformer associated with each of said n output ports is a trifilar wound transformer.

5. A divider network according to claim 1, wherein said another transformer is sized so as to handle P watts, where P is the wattage of the input signal.

6. A divider network according to claim 5, wherein each transformer associated with said n output ports is sized so as to handle P/n watts.

* * * * *